(12) United States Patent
Chen et al.

(10) Patent No.: US 12,151,694 B2
(45) Date of Patent: Nov. 26, 2024

(54) AUTOMOBILE DIAGNOSIS DEVICE, SYSTEM AND METHOD

(71) Applicant: AUTEL INTELLIGENT TECHNOLOGY CORP., LTD., Guangdong (CN)

(72) Inventors: Huaming Chen, Guangdong (CN); Haibo Pang, Guangdong (CN); Yong Chen, Guangdong (CN); Fengji Bi, Guangdong (CN); Kai Liu, Guangdong (CN); Yuanping Luo, Guangdong (CN)

(73) Assignee: AUTEL INTELLIGENT TECHNOLOGY CORP., LTD., Guangdong (CN)

( * ) Notice: Subject to any disclaimer, the term of this patent is extended or adjusted under 35 U.S.C. 154(b) by 387 days.

(21) Appl. No.: 17/658,676

(22) Filed: Apr. 11, 2022

(65) Prior Publication Data

US 2022/0234602 A1   Jul. 28, 2022

Related U.S. Application Data

(63) Continuation of application No. PCT/CN2020/120870, filed on Oct. 14, 2020.

(30) Foreign Application Priority Data

Oct. 24, 2019   (CN) .......................... 201911019654.8

(51) Int. Cl.
*B60W 50/04*   (2006.01)
*G01R 13/00*   (2006.01)
(Continued)

(52) U.S. Cl.
CPC .......... *B60W 50/045* (2013.01); *G01R 13/00* (2013.01); *G01R 31/007* (2013.01); *G07C 5/008* (2013.01);
(Continued)

(58) Field of Classification Search
CPC .......... B60W 50/045; B60W 2050/048; G01R 13/00; G01R 31/007; G07C 5/008;
(Continued)

(56) References Cited

U.S. PATENT DOCUMENTS 8,935,447 B2    1/2015  Martini et al.
9,401,054 B2 *  7/2016  Fountain .............. G07C 5/0808
(Continued)

FOREIGN PATENT DOCUMENTS

CA          2838632 A1 *  7/2014  ............. G06F 17/00
CN          201707601 U    1/2011
(Continued)

OTHER PUBLICATIONS

The extended European Search report dated Aug. 25, 2022; Appln. No. 20879645.8.
(Continued)

*Primary Examiner* — Mary Cheung
(74) *Attorney, Agent, or Firm* — Frank Gao, Esq.

(57) ABSTRACT

Disclosed are an automobile diagnosis device, system and method. The automobile diagnosis device includes: a diagnosis protocol transceiver configured to fault code data of an automobile to be diagnosed; a communication module; a master controller electrically connected to the diagnosis protocol transceiver and the communication module; a multimeter circuit electrically connected to the master controller and configured to send multimeter data to the master controller; an oscilloscope circuit electrically connected to the communication module and configured to send oscilloscope data to the host computer by means of the communication module; a signal generating circuit electrically connected to the master controller and configured to generate an analog
(Continued)

waveform signal in response to a driving signal of the master controller. The adaptability of the automobile diagnosis device is improved.

17 Claims, 4 Drawing Sheets

(51) Int. Cl.
*G01R 31/00* (2006.01)
*G07C 5/00* (2006.01)
*G07C 5/08* (2006.01)

(52) U.S. Cl.
CPC ..... *G07C 5/0808* (2013.01); *B60W 2050/048* (2013.01)

(58) Field of Classification Search
CPC .......... G01C 5/0808; G05B 2219/2637; G05B 19/042; G05B 23/0262; G05B 2219/24065
See application file for complete search history.

(56) References Cited

U.S. PATENT DOCUMENTS

| | | | |
|---|---|---|---|
| 2012/0053778 A1* | 3/2012 | Colvin | G06F 11/0739 |
| | | | 701/31.4 |
| 2018/0047222 A1* | 2/2018 | Lewis | G07C 5/008 |

FOREIGN PATENT DOCUMENTS

| | | | |
|---|---|---|---|
| CN | 201882056 U | | 6/2011 |
| CN | 102346926 A | * | 2/2012 |
| CN | 102735896 A | | 10/2012 |
| CN | 102819243 A | | 12/2012 |
| CN | 205721347 U | * | 11/2016 |
| CN | 110703736 A | | 1/2020 |
| KR | 20150062744 A | | 6/2015 |

OTHER PUBLICATIONS

First Office action of European application No. 20 879 645.8 dated Sep. 6, 2023.
No Author Name Supplied in Source Data ED—Darl Kuhn: "External Hazard Light System for Monitoring Transmission Failure", ip.com, ip.com Inc., West Henrietta, NY, US, Nov. 10, 2000 (Nov. 10, 2000), XP013000079, ISSN: 1533-0001.
International search report of PCT/CN2020/120870.

\* cited by examiner

AUTOMOBILE DIAGNOSIS DEVICE, SYSTEM AND METHOD

CROSS REFERENCE TO RELATED APPLICATIONS

This present application is continuation application of International Application No. PCT/CN2020/120870, filed on Oct. 24, 2020, which claims priority to the Chinese patent application No. 201911019654.8, filed on Oct. 24, 2019, the entire contents of which are incorporated herein by reference.

BACKGROUND

Technical Field

The present application relates to the technical field of automobile diagnosis, and more particularly to an automobile diagnosis device, system, and method.

Related Art

When a certain circuit in an automotive electronic control system fails, its fault information is stored in the form of a fault code in the automotive electronic control system.

At present, the fault code is read by using an automobile diagnosis device and sent to a host computer for visual display to achieve fault diagnosis. However, for some circuit faults, the voltage, current, and signal waveform thereof need to be measured to accurately determine the specific fault cause represented by the fault code. In this kind of circuit fault scenario, the traditional automobile diagnosis device can not achieve fault diagnosis and has poor adaptability.

SUMMARY

Embodiments of the present application provide an automobile diagnosis device, system, and method which are capable of improving the adaptability of the automobile diagnosis device.

In order to solve the above technical problem, embodiments of the present application provide the following technical solutions.

In the first aspect, an embodiment of the present application provides an automobile diagnosis device, comprising:
  a diagnosis protocol transceiver configured to acquire fault code data of an automobile to be diagnosed;
  a communication module;
  a master controller respectively electrically connected to the diagnosis protocol transceiver and the communication module, and configured to send the fault code data to a host computer via the communication module;
  a multimeter circuit electrically connected to the master controller, and configured to send multimeter data to the master controller so that the master controller forwards the multimeter data to the host computer via the communication module;
  an oscilloscope circuit electrically connected to the communication module, and configured to send oscilloscope data to the host computer via the communication module; and
  a signal generating circuit electrically connected to the master controller, configured to generate an analog waveform signal in response to a driving signal of the master controller.

The multimeter circuit comprises:
  a first probe for grounding;
  a second probe;
  a channel selection circuit respectively electrically connected to the second probe and the master controller, and configured to switch to a corresponding test channel for testing, and generate a testing signal according to a channel selection instruction sent by the master controller; and
  a multmetro chip respectively electrically connected to the channel selection circuit and the master controller, and configured to send the multimeter data to the master controller according to the testing signal.

The multimeter circuit further comprises a high voltage protection circuit electrically connected between the channel selection circuit and the second probe, and the high voltage protection circuit is configured to perform a high voltage protection processing of an analog signal transmitted by the second probe.

The oscilloscope circuit comprises:
  a plurality of detection channel circuits, each of the detection channel circuits configured to detect and process the analog signal;
  a first switching circuit comprising a plurality of analog switches, each of the analog switches being electrically connected to one corresponding detection channel circuit;
  an analog-digital conversion circuit electrically connected to each of the analog switches respectively, wherein when a target analog switch works in a conducting state, a processed analog signal is input into the analog-digital conversion circuit via the target analog switch, and the analog-digital conversion circuit converts the processed analog signal into a digital signal; and
  a slave controller electrically connected to the communication module and the analog-digital conversion circuit respectively, and configured to obtain oscilloscope data according to the digital signal and send the oscilloscope data to the host computer via the communication module.

The detection channel circuit comprises:
  a signal conditioning circuit configured to detect the analog signal and perform signal conditioning on the analog signal; and
  a differentiator electrically connected to the signal conditioning circuit and one corresponding analog switch, and configured to process signal conditioned analog signal to obtain a differential signal.

The detection channel circuit further comprises a second switching circuit electrically connected between the signal conditioning circuit and the differentiator, and the second switching circuit is further electrically connected to the diagnosis protocol transceiver. When the second switching circuit works in a first switch state under the control of the diagnosis protocol transceiver, the signal conditioned analog signal is transmitted to the differentiator via the second switching circuit. When the second switching circuit works in a second switch state under the control of the diagnosis protocol transceiver, a communication waveform signal corresponding to the fault code data sent from the diagnosis protocol transceiver is transmitted to the differentiator via the second switching circuit.

The signal conditioning circuit comprises:
  a sonde for detecting the analog signal;
  a signal attenuation circuit electrically connected to the sonde, and configured to attenuate the analog signal; and an operational amplifier electrically connected to the signal attenuation circuit, and configured to amplify an attenuated analog signal.

The slave controller comprises:
an FPGA chip electrically connected to the analog-digital conversion circuit, and configured to obtain oscilloscope communication data according to the digital signal; and
a data conversion unit electrically connected to the FPGA chip and the communication module, and configured to convert the oscilloscope communication data into oscilloscope data and send the oscilloscope data to the host computer via the communication module.

The signal generating circuit comprises:
a signal amplification circuit electrically connected to the master controller, and configured to amplify the driving signal sent by the master controller to obtain an analog waveform signal;
a first terminal electrically connected to the signal amplification circuit, and configured to transmit the analog waveform signal; and
a second terminal for grounding.

The communication module comprises:
a plurality of communication interface circuits for communicating with the host computer;
a signal converting unit electrically connected to the master controller and the slave controller respectively, and configured to convert data sent by the master controller or the slave controller into communication data of a corresponding communication interface circuit; and
a communication chip electrically connected to the signal converting unit and each of the communication interface circuits respectively, and configured to send a communication signal, select a target interface circuit according to the communication signal, and send data sent by the master controller or the oscilloscope circuit to the host computer via the target interface circuit.

The plurality of communication interface circuits comprise a USB interface circuit, a WIFI interface circuit, and a Bluetooth interface circuit.

The signal converting unit comprises:
a USB hub electrically connected to the master controller and the oscilloscope circuit respectively, and configured to forward data sent by the master controller or the oscilloscope circuit; and
a USB changeover switch electrically connected to the USB hub, the communication chip, and the USB interface circuit respectively, wherein when the communication signal controls the USB changeover switch to work in a third switch state, the data forwarded by the USB hub is transmitted to the communication chip via the USB changeover switch; when the communication signal controls the USB changeover switch to work in a fourth switch state, the data forwarded by the USB hub is transmitted to the USB interface circuit via the USB changeover switch.

In the second aspect, an embodiment of the present application also provides an automobile diagnosis system, comprising:
the automobile diagnosis device as described above; and
a host computer communicatively connected to the automobile diagnosis device for displaying diagnostic data sent by the automobile diagnosis device.

In the third aspect, an embodiment of the present application also provides an automobile diagnosis method applied to the automobile diagnosis device as described in above, the method comprising:
receiving a diagnostic mode instruction;
adjusting to a diagnostic working state pointed to by the diagnostic mode instruction and generating diagnostic data corresponding to the diagnostic working state, wherein the diagnostic working state comprises a fault code diagnostic state, and a combination of the fault code diagnostic state with at least one of diagnostic states of an oscilloscope diagnostic state, a multimeter diagnostic state, and a signal generator diagnostic state;
and according to the diagnostic data, acquiring fault information corresponding to the fault code data.

In some embodiments, when the communication module comprises a plurality of communication interface circuits, the method further comprises:
acquiring diagnostic data and a communication transmission instruction;
and selecting a communication interface circuit pointed to by the communication transmission instruction to send the diagnostic data to the host computer.

In some embodiments, when the automobile diagnosis device works in a fault code diagnostic state and an oscilloscope diagnostic state, the method further comprises:
sending a control instruction to the oscilloscope circuit via the diagnosis protocol transceive; enabling the oscilloscope circuit to cut off a signal conditioning loop in the oscilloscope circuit according to the control instruction, and to connect a signal loop between the diagnosis protocol transceiver and the oscilloscope circuit; and enabling the diagnosis protocol transceiver to transmit a communication waveform signal corresponding to the fault code data to the communication module via the signal loop.

Beneficial effects of the present application are as follows: in contrast to the prior art, embodiments of the present application provide an automobile diagnosis device, system, and method. The multimeter data is sent to the master controller via a multimeter circuit so that the master controller forwards the multimeter data to the host computer via the communication module; the oscilloscope circuit sends oscilloscope data to the host computer via the communication module; the signal generating circuit generates an analog waveform signal in response to a driving signal of the master controller. Therefore, the automobile diagnosis device provided by the embodiments of the present application, by integrating the multimeter circuit, the oscilloscope circuit, and the signal generating circuit, avoids a problem that a specific fault cause cannot be accurately determined using only fault code data, and improves the adaptability of the automobile diagnosis device.

BRIEF DESCRIPTION OF THE DRAWINGS

One or more embodiments are exemplified by the accompanying drawings corresponding thereto. These exemplified descriptions do not constitute a limitation on the embodiments. Elements in the drawings having the same reference number designations are illustrated as similar elements, and unless otherwise particularly stated, the drawings do not constitute a proportional limitation.

DETAILED DESCRIPTION

In order to facilitate the understanding of the present application, a more detailed description of the present application will be rendered below by reference to the accompanying drawings and preferred embodiments. It needs to be noted that when one element is referred to as being "connected" to another element, it can be directly connected to the other element or one or more intervening elements may be provided in between. Furthermore, the terms "first", "second", and the like are used for descriptive purposes only and are not to be construed as indicating or implying relative importance.

Unless defined otherwise, all technical and scientific terms used herein have the same meaning as commonly understood by one of ordinary skill in the art to which the present application belongs. The terms used in the description of the present application are for the purpose of describing particularly preferred embodiments only and are not intended to be limiting of the present application. As used herein, the term "and/or" includes any and all combinations of one or more of the associated listed items.

Furthermore, the technical features involved in different embodiments of the present application described below can be combined with each other as long as they do not conflict with each other.

Figure 1:
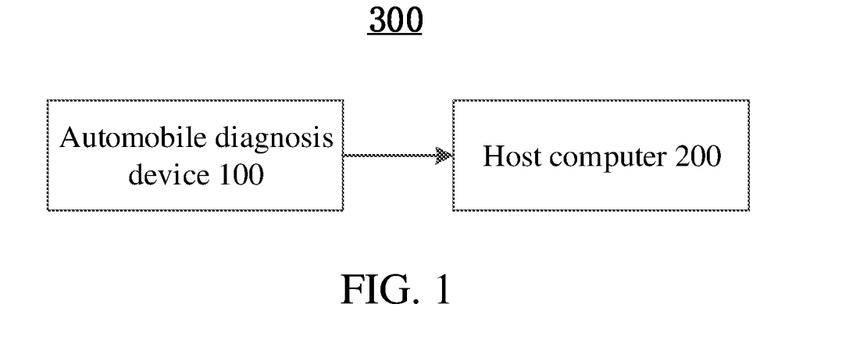
FIG. 1 is a schematic view showing a structure of an automobile diagnosis system provided by an embodiment of the present application.

Referring to FIG. 1, a schematic view showing a structure of an automobile diagnosis system provided by an embodiment of the present application is shown. As shown in FIG. 1, an automobile diagnosis system 300 includes an automobile diagnosis device 100 and a host computer 200 communicatively connected to the automobile diagnosis device 100. The automobile diagnosis device 100 is connected to an automobile to be diagnosed (not shown in FIG. 1), and is configured to acquire diagnostic data of the automobile and send the diagnostic data to the host computer 200. The host computer 200 is configured to display the diagnostic data sent by the automobile diagnosis device 100.

In the embodiment of the present application, the automobile diagnosis system 300 avoids a problem of a specific cause of failure that cannot be accurately determined using only failure code data, and that improves the adaptability of the automobile diagnosis system 300 by means of employing the automobile diagnosis device 100 disclosed in any embodiment described below. Technical details not described in detail in the embodiment can be found in the following embodiment.

Figure 2:
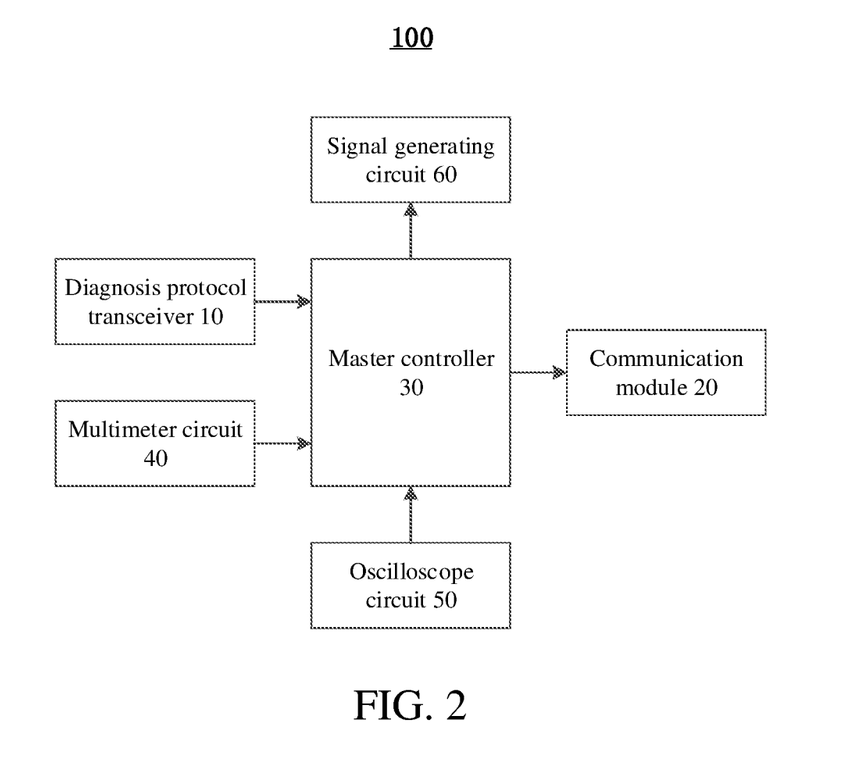
FIG. 2 is a schematic view showing the structure of an automobile diagnosis device provided by an embodiment of the present application.

Referring to FIG. 2, a schematic view showing the structure of an automobile diagnosis device provided by an embodiment of the present application is shown. As shown in FIG. 2, the automobile diagnosis device 100 includes a diagnosis protocol transceiver 10, a communication module 20, a master controller 30, a multimeter circuit 40, an oscilloscope circuit 50, and a signal generating circuit 60.

The diagnosis protocol transceiver 10 is configured to acquire the fault code data of an automobile to be diagnosed.

The diagnosis protocol transceiver 10 comprises a diagnosis interface and a serial peripheral interface (not shown in FIG. 2). The diagnosis interface is configured to receive fault code data stored in an automobile electronic control system of the automobile to be detected. The diagnosis protocol transceiver 10 is configured to detect a communication protocol on which the fault code data is based, and send the fault code data of a specific communication protocol to the master controller 30 via the serial peripheral interface.

In some embodiments, the diagnosis protocol transceiver 10 further comprises a protocol controller. The protocol controller is connected to the master controller 30 and can adopt, for example, an integrated circuit MCP2515. The integrated circuit MCP2515 is an independent CAN (Controller Area Network, a protocol controller), which supports CAN V2.0B technical specification, and can filter out unwanted data messages and reduce the overhead of the master controller 30.

Figure 3:
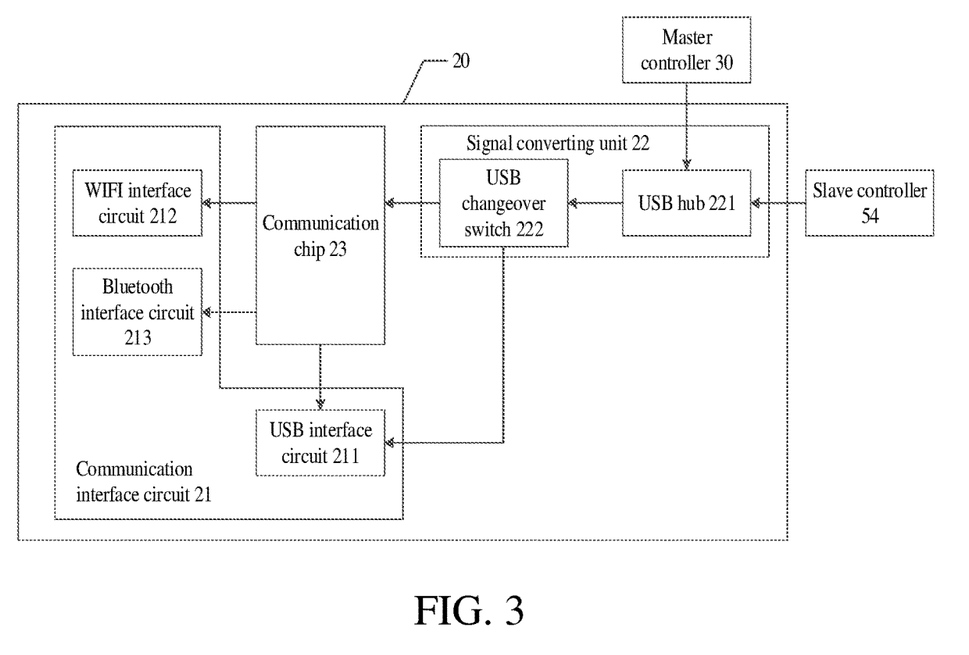
FIG. 3 is a schematic view showing the structure of a communication module provided by an embodiment of the present application.
Figure 5:
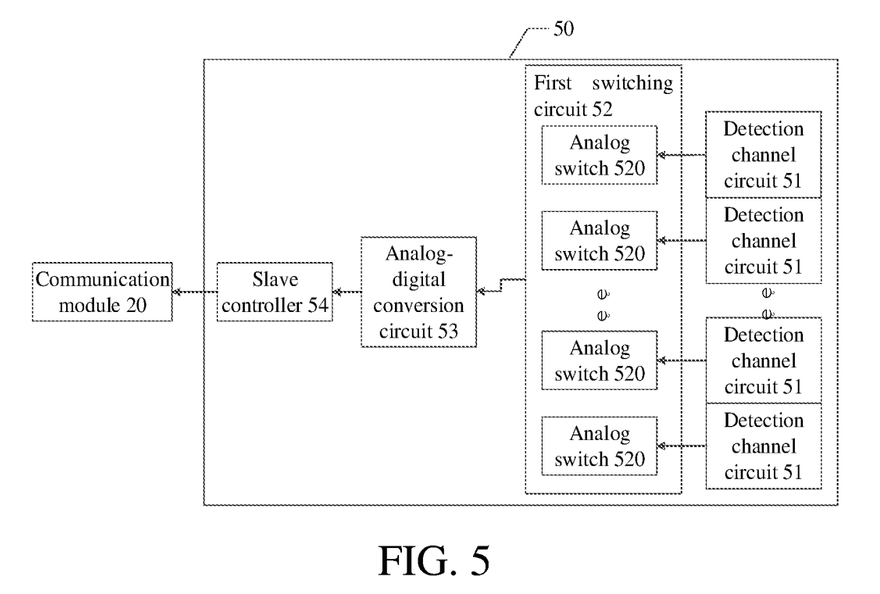
FIG. 5 is a schematic view showing the structure of an oscilloscope circuit provided by an embodiment of the present application.

Referring to FIGS. 3 and 5 together, the communication module 20 includes a plurality of communication interface circuits 21, a signal converting unit 22, and a communication chip 23.

Each of the communication interface circuits 21 is configured to communicate with the host computer 200.

In the present embodiment, the plurality of communication interface circuits 21 include a USB interface circuit 211, a WIFI interface circuit 212, and a Bluetooth interface circuit 213.

The signal converting unit 22 is electrically connected to the master controller 30 and a slave controller 54, respectively. The signal converting unit 22 is configured to convert the data sent by the master controller 30 or the slave controller 54 into communication data of a corresponding communication interface circuit 21.

The signal converting unit 22 includes a USB hub 221 and a USB changeover switch 222.

The USB hub 221 is electrically connected to the master controller 30 and the oscilloscope circuit 50, respectively. The USB hub 221 is configured to forward the data sent by the master controller 30 or the oscilloscope circuit 50.

In the present embodiment, the fault code data and/or multimeter data sent by the master controller 30 and the oscilloscope data sent by the slave controller 54 are both USB-type data.

The USB changeover switch 222 is electrically connected to the USB hub 221, the communication chip 23 and the USB interface circuit 211, respectively. When the communication signal controls the USB changeover switch 222 to work in a third switch state, the data forwarded by the USB hub 221 is transmitted to the communication chip 23 via the USB changeover switch 222; when the communication signal controls the USB changeover switch 222 to work in a fourth switch state, the data forwarded by the USB hub 221 is transmitted to the USB interface circuit 211 through the USB changeover switch 222.

When the communication signal controls the USB changeover switch 222 to work in the third switch state, according to a control instruction of the communication chip 23, the WIFI interface circuit 212 or the Bluetooth interface circuit 213 is gated to transmit the data forwarded by the USB hub 221 to the host computer 200.

The communication chip 23 is electrically connected to the signal converting unit 22 and each of the communication interface circuits 21, respectively. The communication chip 23 is configured to send a communication signal, select a target interface circuit according to the communication signal, and send the data sent by the master controller 30 or the oscilloscope circuit 50 to the host computer 200 via the target interface circuit.

In the present embodiment, the communication chip 23 comprises a radio frequency controller, a DDR random access memory, and an SPI flash memory. The radio frequency controller is respectively connected to the DDR random access memory, the SPI flash memory, the USB changeover switch 222, the WIFI interface circuit 212, and the Bluetooth interface circuit 213.

Specifically, the target interface circuit refers to a USB interface circuit 211, a WIFI interface circuit 212, or a Bluetooth interface circuit 213. The communication chip 23 forwards the diagnostic data to the host computer 200 via the target interface circuit, and display the diagnostic data on the host computer 200. In the embodiment, the host computer 200 supports at least three communication transmission modes of USB, WIFI, and Bluetooth.

When the automobile diagnosis device 100 is powered on again, the target interface circuit is consistent with the target interface circuit at the last power-on. If the target interface circuit needs to be replaced, the communication chip 23 updates the communication signal according to a selection instruction of the host computer 200, and the communication signal is sent to the USB changeover switch 222, the WIFI interface circuit 212, or the Bluetooth interface circuit 213, and the USB changeover switch 222, the WIFI interface circuit 212 or the Bluetooth interface circuit 213 is selected as a new target interface circuit.

The master controller 30 is electrically connected to the diagnosis protocol transceiver 10 and the communication module 20, respectively. The master controller 30 is configured to send the fault code data to the host computer 200 via the communication module 20.

In the present embodiment, the master controller 30 comprises a single chip microcomputer and peripheral circuits thereof. The single chip microcomputer may adopt 51 series, Arduino series, STM32 series of microcomputers, etc.

In some embodiments, the master controller 30 may also be a general purpose processor, a digital signal processor (DSP), an application specific integrated circuit (ASIC), a field programmable gate array (FPGA), an ARM (Acorn RISC Machine) or other programmable logic devices, discrete gate or transistor logic, discrete hardware components, or any combination of these parts; it can also be any traditional processor, controller, microcontroller or state machine; it may also be implemented as a combination of computing devices, e. g. a combination of a DSP and a microprocessor, a plurality of microprocessors, one or more microprocessors in conjunction with a DSP core, or any other such configuration.

The multimeter circuit 40 is electrically connected to the master controller 30, and is configured to send multimeter data to the master controller 30 so that the master controller 30 forwards the multimeter data to the host computer 200 via the communication module 20.

Figure 4:
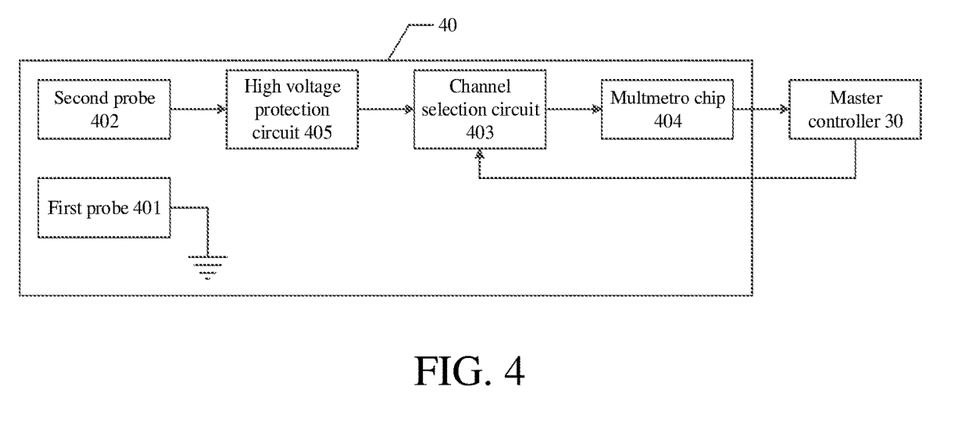
FIG. 4 is a schematic view showing the structure of a multimeter circuit provided by an embodiment of the present application.

Referring to FIG. 4, the multimeter circuit 40 includes a first probe 401, a second probe 402, a high voltage protection circuit 405, a channel selection circuit 403, and a multmetro chip 404.

The first probe 401 is used for grounding (GND).

The first probe 401 is a negative electrode probe of the multimeter circuit 40, the second probe 402 is a positive electrode probe of the multimeter circuit 40, and a test end of the first probe 401 and the test end of the second probe 402 simultaneously act on a circuit under test. A closed loop is formed among the first probe 401, the second probe 402, and the circuit under test. The current signal flows from the first probe 401 into the second probe 402 inside the automobile diagnosis device 100.

The high voltage protection circuit 405 is electrically connected between the channel selection circuit 403 and the second probe 402 for performing high-voltage protection processing on the analog signal transmitted by the second probe 402.

In some embodiments, the high voltage protection circuit 405 may be omitted.

The channel selection circuit 403 is electrically connected to the second probe 402 and the master controller 30 respectively. The channel selection circuit 403 is configured to switch to a corresponding test channel for testing, and generate a testing signal according to a channel selection instruction sent by the master controller 30.

In the present embodiment, the test channel of the multimeter circuit 40 comprises a resistance test channel, an alternating current test channel, an alternating voltage test channel, a direct current test channel, a direct voltage test channel, a capacitance test channel, a diode test channel, a triode test channel, a buzzer test channel, etc. The corresponding testing signal comprises a resistance signal, an alternating current signal, an alternating voltage signal, a direct current signal, a direct voltage signal, a capacitance signal, a diode voltage drop signal, a triode voltage drop signal, a buzzer signal, etc. For example, when the channel selection circuit 403 switches to a direct current voltage test channel for testing according to a channel selection instruction sent by the master controller 30, the connection end of the first probe 401 is controlled to switch to connect to the "COM" end, and the connection end of the second probe 402 is controlled to switch to connect to the "VΩ" end.

The multmetro chip 404 is respectively electrically connected to the channel selection circuit 403 and the master controller 30 for sending the multimeter data to the master controller 30 according to the testing signal.

The multmetro chip 404 sends the multimeter data to the master controller 30 via a serial peripheral interface. The multimeter data is serial data.

The oscilloscope circuit 50 is electrically connected to the communication module 20, and configured to send oscilloscope data to the host computer 200 via the communication module 20.

Referring again to FIG. 5, the oscilloscope circuit 50 includes several detection channel circuits 51, a first switching circuit 52, an analog-digital conversion circuit 53, and a slave controller 54.

Each of the detection channel circuits 51 is configured to detect and process an analog signal.

The oscilloscope data is a waveform curve signal, and according to the waveform curve signal, signal parameters such as voltage, current, frequency, phase difference, and amplitude modulation of the analog signal can be measured.

Figure 6:
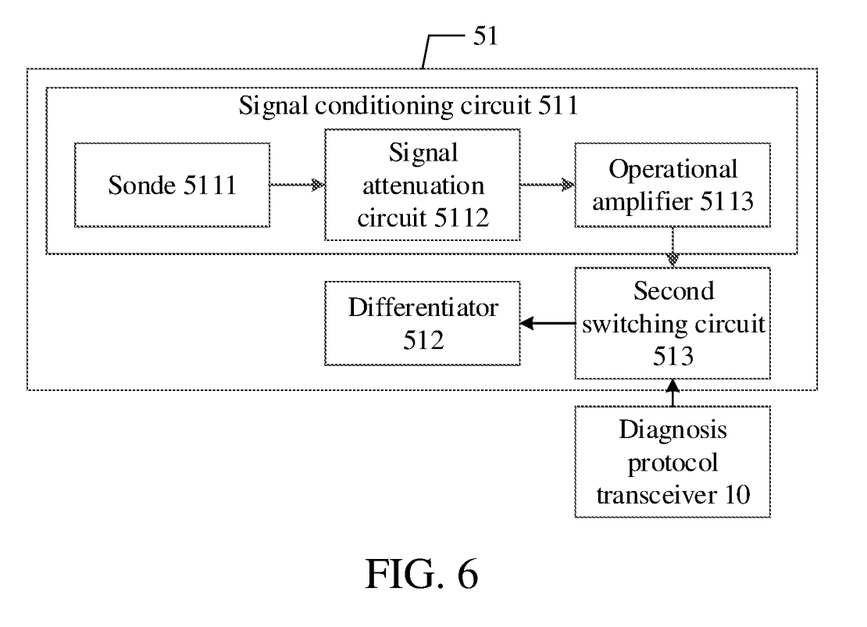
FIG. 6 is a schematic view showing the structure of a detection channel circuit provided by an embodiment of the present application.

Referring to FIG. 6, the detection channel circuit 51 includes a signal conditioning circuit 511 and a differentiator 512.

The signal conditioning circuit 511 is configured to detect the analog signal and perform signal conditioning on the analog signal.

Further, the signal conditioning circuit 511 includes a sonde 5111, a signal attenuation circuit 5112, and an operational amplifier 5113.

The sonde 5111 is configured to detect the analog signal. The signal attenuation circuit 5112 is electrically connected to the sonde 5111, and is configured to attenuate the analog signal. The operational amplifier 5113 is electrically connected to the signal attenuation circuit 5112, and is configured to amplify the attenuated analog signal.

The differentiator 512 is electrically connected to the signal conditioning circuit 511 and one corresponding analog switch 520, and is configured to process the signal conditioned analog signal to obtain a differential signal.

In some embodiments, the detection channel circuit 51 further comprises a second switching circuit 513.

The second switching circuit 513 is electrically connected between the signal conditioning circuit 511 and the differentiator 512, and the second switching circuit 513 is also electrically connected to the diagnosis protocol transceiver 10. When the second switching circuit 513 works in a first switch state under the control of the diagnosis protocol transceiver 10, the signal-conditioned analog signal is transmitted to the differentiator 512 via the second switching circuit 513; when the second switching circuit 513 works in a second switch state under the control of the diagnosis protocol transceiver 10, a communication waveform signal corresponding to the fault code data transmitted from the diagnosis protocol transceiver 10 is transmitted to the differentiator 512 through the second switching circuit 513.

In summary, the communication waveform signal corresponding to the fault code data is converted into oscilloscope data through the second switching circuit 513, and is displayed on the host computer 200 in the form of a waveform curve signal. The display is more visual, facilitating data comparison with the multimeter data and, the oscilloscope data corresponding to the analog signal detected and processed by the detection channel circuit 51.

The first switching circuit 52 includes a plurality of analog switches 520, each of which is electrically connected to one corresponding detection channel circuit 51.

The analog-digital conversion circuit 53 is electrically connected to each of the analog switches 520 respectively. When a target analog switch works in a conducting state, a processed analog signal is input into the analog-digital conversion circuit 53 via the target analog switch, and the analog-digital conversion circuit 53 converts the processed analog signal into a digital signal.

The slave controller 54 is electrically connected to the communication module 20 and the analog-digital conversion circuit 53 respectively. The slave controller 54 is configured to obtain oscilloscope data according to the digital signal, and send the oscilloscope data to the host computer 200 via the communication module 20.

Figure 7:
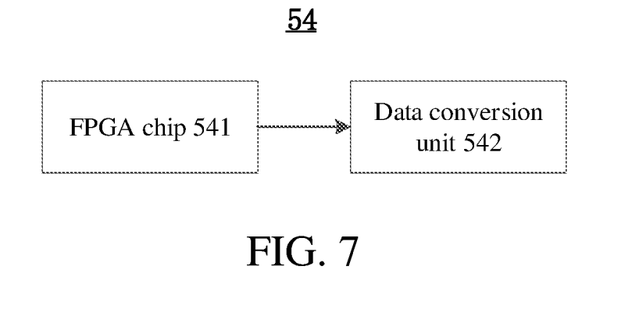
FIG. 7 is a schematic view showing the structure of a slave controller provided by an embodiment of the present application.

Referring to FIG. 7, the slave controller 54 includes an FPGA chip 541 and a data conversion unit 542.

The FPGA chip 541 is electrically connected to the analog-digital conversion circuit 53, and is configured to obtain oscilloscope communication data according to the digital signal. The data conversion unit 542 is electrically connected to the FPGA chip 541 and the communication module 20, and is configured to convert the oscilloscope communication data into oscilloscope data and send the oscilloscope data to the host computer 200 via the communication module 20.

In the present embodiment, the working state of the analog switch 520 is controlled via the FPGA chip 541, and an analog signal processed by one corresponding detection channel circuit 51 can be selectively output to the analog-digital conversion circuit 53. The oscilloscope communication data is parallel data, and is transmitted to the data conversion unit 542 via a parallel interface of the FPGA chip 541. The data conversion unit 542 converts the oscilloscope communication data into oscilloscope data, the oscilloscope data being USB type data. The oscilloscope data is sent to the USB hub 221 via a USB interface of the data conversion unit 542.

The signal generating circuit 60 is electrically connected to the master controller 30, and is configured to generate an analog waveform signal in response to a driving signal of the master controller 30.

Figure 8:
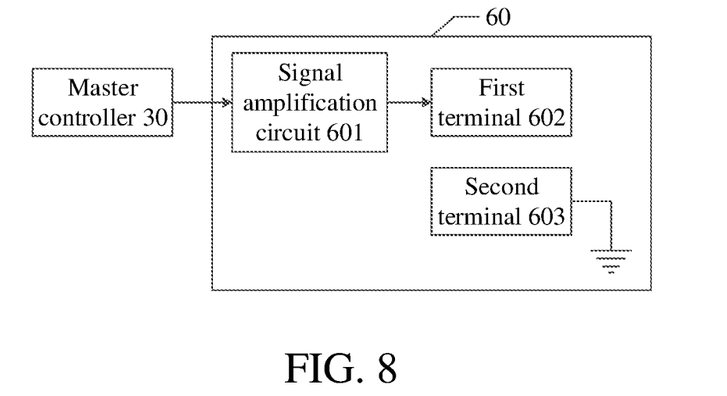
FIG. 8 is a schematic view showing the structure of a signal generating circuit provided by an embodiment of the present application.

Referring to FIG. 8, the signal generating circuit 60 includes a signal amplification circuit 601, a first terminal 602, and a second terminal 603.

The signal amplification circuit 601 is electrically connected to the master controller 30, and configured to amplify a driving signal sent by the master controller 30 to obtain an analog waveform signal. The first terminal 602 is electrically connected to the signal amplification circuit 601, and is configured to transmit the analog waveform signal. The second terminal 603 is also used for grounding (GND).

The signal generating circuit 60 is connected to a circuit under test, and the analog waveform signal amplified by the signal amplification circuit 601 acts on the circuit under test to trigger the operation of a target chip of the circuit under test, so as to realize the fault detection in the case where the fault cause can be accurately determined only when the target chip of the circuit under test works.

It needs to be noted that the diagnosis protocol transceiver 10, the communication module 20, the master controller 30, the multimeter circuit 40, the oscilloscope circuit 50, and the signal generating circuit 60 are all installed in the automobile diagnosis device 100. That is to say, the automobile diagnosis device 100 has a fault code detection function, a multimeter function, an oscilloscope function, and a signal generating function, and has a larger scope of application based on the fault code detection function, the multimeter function, the oscilloscope function, and the signal generating function.

In some embodiments, the automobile diagnosis device 100 further includes a power supply module, a key module, and an input module (not shown in FIG. 8).

The power supply module is connected to the master controller 30 for supplying a power supply voltage to the master controller 30. The power supply module comprises a battery connected to the master controller 30 and a power supply management circuit respectively connected to the battery and the master controller 30.

The key module is connected to the master controller 30, and is configured to generate an operation instruction according to the user operation and send the operation instruction to the master controller 30, so that the master controller 30 executes a corresponding operation according to the operation instruction. The operation instruction comprises an acquisition instruction, a diagnostic mode instruction, etc. For example, when the operation instruction is an acquisition instruction, the master controller 30 controls the diagnosis protocol transceiver 10 to acquire the fault code data of the automobile to be diagnosed.

The input module is connected to the diagnosis protocol transceiver 10, the master controller 30, and the communication chip 23. The input module is configured receive diagnostic data uploaded by automobile mastertenance personnel. Under the action of the master controller 30, the diagnostic data is forwarded to the communication chip 23, and sent to the host computer 200 via a target communication interface circuit. The input module comprises an input communication interface and an input hub. The input communication interface is configured to receive diagnostic data uploaded by automobile mastertenance personnel. The input hub is respectively connected to the input communication interface, the master controller 30, and the communication chip 23. The input hub is configured to forward the diagnostic data to the communication chip 23 and send the same to the host computer 200 via a target communication interface circuit.

In the the embodiments of the present application, the automobile diagnosis device 100 sends multimeter data to the master controller 30 via a multimeter circuit 40 so that the master controller 30 forwards the multimeter data to the host computer 200 via the communication module 20. The oscilloscope circuit 50 sends oscilloscope data to the host computer 200 via the communication module 20. The signal generating circuit 60 generates an analog waveform signal in response to a driving signal of the master controller 30. Therefore, the automobile diagnosis device 100, by integrating the multimeter circuit 40, the oscilloscope circuit 50 and the signal generating circuit 60, avoids a problem that a specific fault cause cannot be accurately determined using only fault code data, and improves the adaptability of the automobile diagnosis device 100.

Figure 9:
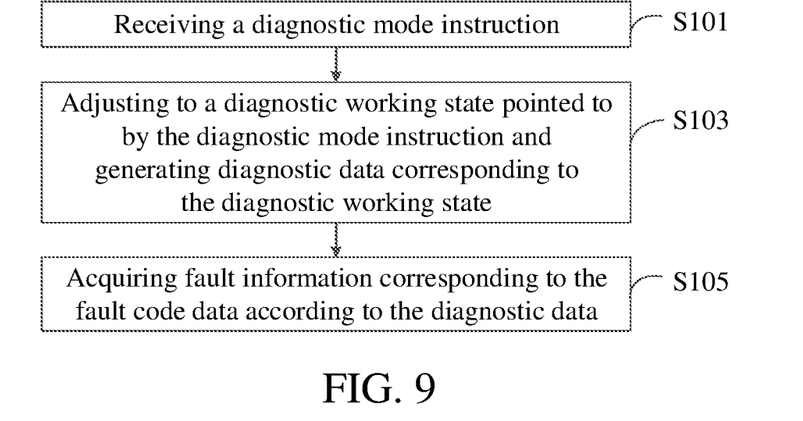
FIG. 9 is a schematic process diagram of an automobile diagnosis method provided by an embodiment of the present application.

Referring to FIG. 9, a schematic process diagram of an automobile diagnosis method provided by an embodiment of the present application is shown. As shown in FIG. 9, the automobile diagnosis method is applied to the automobile diagnosis device 100 disclosed in any of the above embodiments, the method comprising:

S101: receiving a diagnostic mode instruction;

S103: adjusting to a diagnostic working state pointed to by the diagnostic mode instruction and generating diagnostic data corresponding to the diagnostic working state, wherein the diagnostic working state comprises a fault code diagnostic state, and a combination of the fault code diagnostic state with at least one of the diagnostic states of an oscilloscope diagnostic state, a multimeter diagnostic state, and a signal generator diagnostic state;

and S105: according to the diagnostic data, acquiring fault information corresponding to the fault code data.

The fault information comprises a fault location, a fault cause, a maintenance plan, etc.

In the present embodiment, the diagnostic working state includes a fault code diagnostic state, a fault code diagnostic state and an oscilloscope diagnostic state, a fault code diagnostic state and a multimeter diagnostic state, a fault code diagnostic state and a signal generator diagnostic state, a fault code diagnostic state, an oscilloscope diagnostic state and a multimeter diagnostic state, a fault code diagnostic state, an oscilloscope diagnostic state and a signal generator diagnostic state, and a fault code diagnostic state, a multimeter diagnostic state and a signal generator diagnostic state.

Specifically, when adjusting to the fault code diagnostic state, the diagnostic data comprises fault code data; when adjusting to the fault code diagnostic state and oscilloscope diagnostic state, the diagnostic data comprises fault code data and oscilloscope data; when adjusting to the fault code diagnostic state and multimeter diagnostic state, the diagnostic data comprises fault code data and multimeter data; when adjusting to the fault code diagnostic state and signal generator diagnostic state, the diagnostic data includes fault code data; when adjusting to the fault code diagnostic state, oscilloscope diagnostic state, and multimeter diagnostic state, the diagnostic data comprises fault code data, oscilloscope data, and multimeter data; when adjusting to the fault code diagnostic state, oscilloscope diagnostic state, and signal generator diagnostic state, the diagnostic data comprises fault code data and oscilloscope data; when adjusting to the fault code diagnostic state, multimeter diagnostic state, and signal generator diagnostic state, the diagnostic data includes fault code data and multimeter data.

In some embodiments, when the communication module 20 comprises several communication interface circuits 21, the method further comprises: acquiring diagnostic data and communication transmission instruction; and selecting one of the communication interface circuit 21 pointed to by the communication transmission instruction to send the diagnostic data to the host computer 200.

In some embodiments, when the automobile diagnosis device 100 works in the fault code diagnostic state and oscilloscope diagnostic state, the method further comprises: sending a control instruction to the oscilloscope circuit 50 via the diagnosis protocol transceiver 10; enabling the oscilloscope circuit 50 to cut off a signal conditioning loop in the oscilloscope circuit according to the control instruction, and to connect a signal loop between the diagnosis protocol transceiver 10 and the oscilloscope circuit 50; and enabling the diagnosis protocol transceiver 10 to transmit the communication waveform signal corresponding to the fault code data to the communication module 20 via the signal loop.

In the embodiments of the present application, the automobile diagnosis method adjusts to a diagnostic working state pointed to by the diagnostic mode instruction by receiving a diagnostic mode instruction, and generates diagnostic data corresponding to the diagnostic working state. The diagnostic working state comprises a fault code diagnostic state and a combination of the fault code diagnostic state with at least one of the oscilloscope diagnostic state, the multimeter diagnostic state, and the signal generator diagnostic state. The automobile diagnosis method further acquires fault information corresponding to the fault code data according to the diagnostic data. Therefore, the automobile diagnosis method can avoid the problem that a specific fault cause cannot be accurately determined using only the fault code data, and improve the adaptability of the automobile diagnosis device 100.

Finally, it should be noted that: the above embodiments are merely illustrative of the technical solutions of the present application, rather than limiting it; combinations of technical features in the above embodiments or in different embodiments are also possible under the idea of the present application, and the steps can be implemented in any order; there are many other variations of the different aspects of the present application as described above, which are not provided in detail for the sake of brevity; although the present application has been described in detail with reference to the foregoing embodiments, those of ordinary skills in the art will appreciate that the technical solutions disclosed in the above-mentioned embodiments can still be modified, or some of the technical features thereof can be replaced by equivalents; such modifications or replacements do not depart the essence of the corresponding technical solution from the scope of the technical solutions of embodiments of the present application.

What is claimed is:

1. An automobile diagnosis device, comprising:
   a diagnosis protocol transceiver configured to acquire fault code data of an automobile to be diagnosed;
   a communication module;
   a master controller respectively electrically connected to the diagnosis protocol transceiver and the communication module, and configured to send the fault code data to a host computer via the communication module;
   a multimeter circuit electrically connected to the master controller, and configured to send multimeter data to the master controller so that the master controller forwards the multimeter data to the host computer via the communication module;
   an oscilloscope circuit electrically connected to the communication module, and configured to send oscilloscope data to the host computer via the communication module; and
   a signal generating circuit electrically connected to the master controller, and configured to generate an analog waveform signal in response to a driving signal of the master controller;
   wherein the oscilloscope circuit comprises:
   a plurality of detection channel circuits, each of the detection channel circuits configured to detect and process the analog signal;
   a first switching circuit comprising a plurality of analog switches, each of the analog switches being electrically connected to one corresponding detection channel circuit;
   an analog-digital conversion circuit electrically connected to each of the analog switches respectively, wherein when a target analog switch works in a conducting state, a processed analog signal is input into the analog-digital conversion circuit via the target analog switch, and the analog-digital conversion circuit converts the processed analog signal into a digital signal; and
   a slave controller electrically connected to the communication module and the analog-digital conversion circuit respectively, and configured to obtain oscilloscope data according to the digital signal and send the oscilloscope data to the host computer via the communication module.

2. The automobile diagnosis device according to claim 1, wherein the multimeter circuit comprises:
   a first probe for grounding;
   a second probe;
   a channel selection circuit respectively electrically connected to the second probe and the master controller, and configured to switch to a corresponding test channel for testing and generate a testing signal according to a channel selection instruction sent by the master controller; and
   a multmetro chip respectively electrically connected to the channel selection circuit and the master controller, and configured to send the multimeter data to the master controller according to the testing signal.

3. The automobile diagnosis device according to claim 2, wherein the multimeter circuit further comprises a high voltage protection circuit electrically connected between the channel selection circuit and the second probe, and the high voltage protection circuit is configured to perform a high voltage protection processing of an analog signal transmitted by the second probe.

4. The automobile diagnosis device according to claim 1, wherein the detection channel circuit comprises:
   a signal conditioning circuit configured to detect the analog signal and perform signal conditioning on the analog signal; and
   a differentiator electrically connected to the signal conditioning circuit and one corresponding analog switch, and configured to process signal conditioned analog signal to obtain a differential signal.

5. The automobile diagnosis device according to claim 4, wherein the detection channel circuit further comprises a second switching circuit electrically connected between the signal conditioning circuit and the differentiator, and the second switching circuit is further electrically connected to the diagnosis protocol transceiver, wherein:
   when the second switching circuit works in a first switch state under a control of the diagnosis protocol transceiver, the signal conditioned analog signal is transmitted to the differentiator via the second switching circuit; and
   when the second switching circuit works in a second switch state under the control of the diagnosis protocol transceiver, a communication waveform signal corresponding to the fault code data sent from the diagnosis protocol transceiver is transmitted to the differentiator via the second switching circuit.

6. The automobile diagnosis device according to claim 4, wherein the signal conditioning circuit comprises:
   a sonde configured to detect the analog signal;
   a signal attenuation circuit electrically connected to the sonde, and configured to attenuate the analog signal; and
   an operational amplifier electrically connected to the signal attenuation circuit, and configured to amplify an attenuated analog signal.

7. The automobile diagnosis device according to claim 1, wherein the slave controller comprises:
   an FPGA chip electrically connected to the analog-digital conversion circuit, and configured to obtain oscilloscope communication data according to the digital signal; and
   a data conversion unit electrically connected to the FPGA chip and the communication module, and configured to convert the oscilloscope communication data into oscilloscope data and send the oscilloscope data to the host computer via the communication module.

8. The automobile diagnosis device according to claim 1, wherein the signal generating circuit comprises:
   a signal amplification circuit electrically connected to the master controller, and configured to amplify the driving signal sent by the master controller to obtain an analog waveform signal;
   a first terminal electrically connected to the signal amplification circuit, and configured to transmit the analog waveform signal; and
   a second terminal for grounding.

9. The automobile diagnosis device according to claim 1, wherein the communication module comprises:
   a plurality of communication interface circuits for communicating with the host computer;
   a signal converting unit electrically connected to the master controller and the slave controller respectively, and configured to convert data sent by the master controller or the slave controller into communication data of a corresponding communication interface circuit; and a communication chip electrically connected to the signal converting unit and each of the communication interface circuits respectively, and configured to send a communication signal, select a target interface circuit according to the communication signal, and send data sent by the master controller or the oscilloscope circuit to the host computer via the target interface circuit.

10. The automobile diagnosis device according to claim 9, wherein the plurality of communication interface circuits comprise a USB interface circuit, a WIFI interface circuit, and a Bluetooth interface circuit.

11. The automobile diagnosis device according to claim 10, wherein the signal converting unit comprises:
   a USB hub electrically connected to the master controller and the oscilloscope circuit respectively, and configured to forward data sent by the master controller or the oscilloscope circuit;
   and a USB changeover switch electrically connected to the USB hub, the communication chip, and the USB interface circuit respectively, wherein:
   when the communication signal controls the USB changeover switch to work in a third switch state, the data forwarded by the USB hub is transmitted to the communication chip via the USB changeover switch; and
   when the communication signal controls the USB changeover switch to work in a fourth switch state, the data forwarded by the USB hub is transmitted to the USB interface circuit via the USB changeover switch.

12. An automobile diagnosis system, comprising:
   an automobile diagnosis device comprising:
   a diagnosis protocol transceiver configured to acquire fault code data of an automobile to be diagnosed;
   a communication module;
   a master controller respectively electrically connected to the diagnosis protocol transceiver and the communication module, and configured to send the fault code data to a host computer via the communication module;
   a multimeter circuit electrically connected to the master controller, and configured to send multimeter data to the master controller so that the master controller forwards the multimeter data to the host computer via the communication module;
   an oscilloscope circuit electrically connected to the communication module, and configured to send oscilloscope data to the host computer via the communication module; and
   a signal generating circuit electrically connected to the master controller, and configured to generate an analog waveform signal in response to a driving signal of the master controller; and
   a host computer communicatively connected to the automobile diagnosis device for displaying diagnostic data sent by the automobile diagnosis device;
   wherein the oscilloscope circuit comprises:
   a plurality of detection channel circuits, each of the detection channel circuits configured to detect and process the analog signal;
   a first switching circuit comprising a plurality of analog switches, each of the analog switches being electrically connected to one corresponding detection channel circuit;
   an analog-digital conversion circuit electrically connected to each of the analog switches respectively, wherein when a target analog switch works in a conducting state, a processed analog signal is input into the analog-digital conversion circuit via the target analog switch, and the analog-digital conversion circuit converts the processed analog signal into a digital signal; and
   a slave controller electrically connected to the communication module and the analog-digital conversion circuit respectively, and configured to obtain oscilloscope data according to the digital signal and send the oscilloscope data to the host computer via the communication module.

13. The automobile diagnosis system according to claim 12, wherein the multimeter circuit comprises:
   a first probe for grounding;
   a second probe;
   a channel selection circuit respectively electrically connected to the second probe and the master controller, and configured to switch to a corresponding test channel for testing and generate a testing signal according to a channel selection instruction sent by the master controller; and
   a multmetro chip respectively electrically connected to the channel selection circuit and the master controller, and configured to send the multimeter data to the master controller according to the testing signal.

14. The automobile diagnosis system according to claim 13, wherein the multimeter circuit further comprises a high voltage protection circuit electrically connected between the channel selection circuit and the second probe, and the high voltage protection circuit is configured to perform a high voltage protection processing of an analog signal transmitted by the second probe.

15. The automobile diagnosis system according to claim 12, wherein the signal generating circuit comprises:
   a signal amplification circuit electrically connected to the master controller, and configured to amplify the driving signal sent by the master controller to obtain an analog waveform signal;
   a first terminal electrically connected to the signal amplification circuit, and configured to transmit the analog waveform signal; and
   a second terminal for grounding.

16. An automobile diagnosis method, being applied to an automobile diagnosis device, the automobile diagnosis device comprising:
   a diagnosis protocol transceiver configured to acquire fault code data of an automobile to be diagnosed;
   a communication module;
   a master controller respectively electrically connected to the diagnosis protocol transceiver and the communication module, and configured to send the fault code data to a host computer via the communication module;
   a multimeter circuit electrically connected to the master controller, and configured to send multimeter data to the master controller so that the master controller forwards the multimeter data to the host computer via the communication module;
   an oscilloscope circuit electrically connected to the communication module, and configured to send oscilloscope data to the host computer via the communication module;
   a signal generating circuit electrically connected to the master controller, and configured to generate an analog waveform signal in response to a driving signal of the master controller;

wherein the method comprises:

receiving a diagnostic mode instruction;

adjusting to a diagnostic working state pointed to by the diagnostic mode instruction and generating diagnostic data corresponding to the diagnostic working state, wherein the diagnostic working state comprises a fault code diagnostic state, and a combination of the fault code diagnostic state with at least one of diagnostic states of an oscilloscope diagnostic state, a multimeter diagnostic state, and a signal generator diagnostic state; and acquiring fault information corresponding to the fault code data according to the diagnostic data;

wherein when the automobile diagnosis device works in a fault code diagnostic state and an oscilloscope diagnostic state, the method further comprises:

sending a control instruction to the oscilloscope circuit via the diagnosis protocol transceiver;

enabling the oscilloscope circuit to cut off a signal conditioning loop in the oscilloscope circuit according to the control instruction, and to connect a signal loop between the diagnosis protocol transceiver and the oscilloscope circuit; and enabling the diagnosis protocol transceiver a communication waveform signal corresponding to the fault code data to the communication module via the signal loop.

17. The method according to claim 16, wherein when the communication module comprises a plurality of communication interface circuits, the method further comprises:

acquiring diagnostic data and a communication transmission instruction; and selecting a communication interface circuit pointed to by the communication transmission instruction to send the diagnostic data to the host computer.

\* \* \* \* \*